United States Patent
Tseng et al.

(10) Patent No.: US 8,470,637 B2
(45) Date of Patent: Jun. 25, 2013

(54) METHOD FOR FABRICATING A RESISTOR FOR A RESISTANCE RANDOM ACCESS MEMORY

(75) Inventors: Tseung-Yuen Tseng, Hsinchu (TW); Sheng-Yu Wang, Taipei (TW); Chen-Han Tsai, Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 12/793,833

(22) Filed: Jun. 4, 2010

(65) Prior Publication Data
US 2011/0171811 A1    Jul. 14, 2011

(30) Foreign Application Priority Data
Jan. 14, 2010    (TW) .............................. 099100900 A

(51) Int. Cl.
*H01L 21/00*    (2006.01)
(52) U.S. Cl.
USPC .......................................... 438/104; 438/384
(58) Field of Classification Search
USPC .......................................... 438/104, 382–385
See application file for complete search history.

(56) References Cited

U.S. PATENT DOCUMENTS

| 6,440,815 B1 * | 8/2002 | Mitsuhashi | 438/396 |
| 6,602,805 B2 * | 8/2003 | Chang | 438/785 |

OTHER PUBLICATIONS

Yu et al., "X-ray diffraction and electrical characterization of photo-CVD zirconium oxide layers", Applied Surface Science (2003), pp. 374-377.*
Ishii et al. "Growth and electrical properties of atomic-layer deposited ZrO2/Si-nitride stack gate dielectrics", Journal of Applied Physics, vol. 95, No. 2, pp. 536-542, Jan. 2004.*
Lin et al., "Effect of Top Electrode Material on Resistive Switching Properties of Zirconium Oxide Film Memory Devices", IEEE Electron Device Lettersd, vol. 28, No. 5, May 2007, pp. 366-368.*

* cited by examiner

*Primary Examiner* — Richard Booth
(74) *Attorney, Agent, or Firm* — Ladas 7 Parry LLP

(57) ABSTRACT

A method for fabricating a resistor for a resistance random access memory (RRAM) includes: (a) forming a first electrode over a substrate; (b) forming a variable resistance layer of zirconium oxide on the first electrode under a working temperature, which ranges from 175° C. to 225° C.; and (c) forming a second electrode of Ti on the variable resistance layer.

7 Claims, 3 Drawing Sheets

US 8,470,637 B2

METHOD FOR FABRICATING A RESISTOR FOR A RESISTANCE RANDOM ACCESS MEMORY

CROSS-REFERENCE TO RELATED APPLICATION

This application claims priority of Taiwanese application no. 099100900, filed on Jan. 14, 2010.

BACKGROUND OF THE INVENTION

1. Field of the Invention

This invention relates to a method for fabricating a resistor for a resistance random access memory (RRAM), more particularly to a method involving forming a variable resistance layer of zirconium oxide on an electrode under a working temperature ranging from 175° C. to 225° C.

2. Description of the Related Art

Generally, a resistance random access memory (RRAM) circuit is composed of an array of 1T1R cross point memory cells (as described in U.S. Pat. No. 7,208,372), each of which has a transistor and a resistor, or composed of an array of 1D1R cross point memory cells, each of which has a diode and a resistor.

The resistor has a tri-layer structure including a top electrode, a bottom electrode, and an insulating layer sandwiched between the top and bottom electrodes. Transition metal oxides, such as NiO, CuO, $ZrO_2$, $TiO_2$ and $HfO_2$, with a variable resistance are widely used as the insulating layer. The aforesaid transition metal oxides exhibit a property that the resistance thereof can be switched between a high resistance state (which can be referred as OFF-state) and a low resistance state (which can be referred as ON-state) by applying a set (a write action) or a reset (an erasing action) voltage to the resistor. Several mechanisms of resistive switching between ON-state and OFF-state for the resistors have been proposed over the years (as described in U.S. Patent Application Publication No. 2007/0269683). The high and low resistance states of the insulating layer within the resistor can be used to define as a two-state information (0, 1) stored in the RRAM circuit, and can be read by applying a reading voltage to the resistor.

A conventional method for fabricating a resistor for a resistance random access memory (RRAM) (see IEEE ELECTRON DEVICE LETTERS, VOL. 28, NO. 5, PP. 366~368, MAY 2007 by the inventors of the present application) includes the following steps: (A) forming a $SiO_2$ layer on a Si substrate; (B) forming a bottom electrode of a layer structure of Pt/Ti on the $SiO_2$ layer; (C) forming a $ZrO_2$ insulator layer having a layer thickness of 70 nm on the bottom electrode under a working temperature of 250° C. by using a radio-frequency magnetron sputtering system (not shown); and (D) forming a Ti layer, which serves as a top electrode on the $ZrO_2$ insulator layer, by using the radio-frequency magnetron sputtering system.

Since the formation of the resistors comes after the formation of the transistors (or the diodes) during a process of fabricating the resistance random access memory (RRAM) circuit, the working temperature (250° C.) when forming the $ZrO_2$ insulator layer is too high for the fabricated transistors (or the diodes), and would cause defects in the transistors (or the diodes). Furthermore, the life cycle of the resistor is also needed to be enhanced, i.e., more in number of resistive switching times between ON-state and OFF-state that the resistor can endure.

SUMMARY OF THE INVENTION

Therefore, the object of the present invention is to provide a method for fabricating a resistor for a resistance random access memory (RRAM) that can overcome the aforesaid drawbacks of the previous art.

According to this invention, it is provided a method for fabricating a resistor for a resistance random access memory (RRAM) that comprises: (a) forming a first electrode over a substrate; (b) forming a variable resistance layer of zirconium oxide on the first electrode under a working temperature, which ranges from 175° C. to 225° C.; and (c) forming a second electrode of Ti on the variable resistance layer.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

The preferred embodiment of a method for fabricating a resistor for a resistance random access memory (RRAM) according to the present invention includes: (a) forming a first electrode over a substrate; (b) forming a variable resistance layer of zirconium oxide on the first electrode under a working temperature, which ranges from 175° C. to 225° C.; and (c) forming a second electrode of Ti on the variable resistance layer.

Preferably, formation of the variable resistance layer in step (b) is performed by sputtering techniques, and formation of the first and second electrodes in step (a) and (c) is conducted through evaporation techniques.

Preferably, the first electrode has a Ti adhesion layer deposited on the substrate and a Pt electrode layer deposited on the Ti layer.

The following examples and comparative examples are provided to illustrate the merits of the preferred embodiment of the invention, and should not be construed as limiting the scope of the invention.

EXAMPLE 1

E1

The resistor of Example 1 (E1) was prepared by the following steps.

A Si substrate was subjected to wet oxidation so as to form a 200-nm-thick $SiO_2$ layer. Then, the $SiO_2$ layer formed on the Si substrate was put into an electron beam evaporation system with a working pressure of $2\times10^{-6}$ Torr for depositing a bottom electrode which includes a 20-nm-thick Ti adhesion layer on the $SiO_2$ layer and an 80-nm-thick Pt electrode layer on the Ti layer. The assembly was subsequently placed into a radio-frequency (r.f.) magnetron sputtering system with a working pressure of 10 mTorr for depositing a variable resistance layer of 40-nm-thick ZrO$_2$ layer at a working temperature of 175° C. by applying an output power of 150 W to a ZrO$_2$ target in the sputtering system. A mixture of O$_2$ and Ar in a ratio of 6 to 12 was introduced into the sputtering system during the deposition of the variable resistance layer. Finally, the assembly was placed into the evaporation system for depositing a top electrode of Ti layer with a thickness of 150 nm thereon.

EXAMPLE 2

E2

The resistor of Example 2 (E2) was prepared by steps and process conditions similar to those of Example 1 (E1), except that the working temperature was 200° C.

EXAMPLE 3

E3

The resistor of Example 3 (E3) was prepared by steps and process conditions similar to those of Example 1 (E1), except that the working temperature was 225° C.

COMPARATIVE EXAMPLE 1

CE1

The resistor of Comparative Example 1 (CE1) was prepared by steps and process conditions similar to those of Example 1 (E1), except that the working temperature was 150° C.

COMPARATIVE EXAMPLE 2

CE2

The resistor of Comparative Example 2 (CE2) was prepared by steps and process conditions similar to those of Example 1 (E1), except that the working temperature was 250° C.

<Electrical Analysis>

Figure 1:
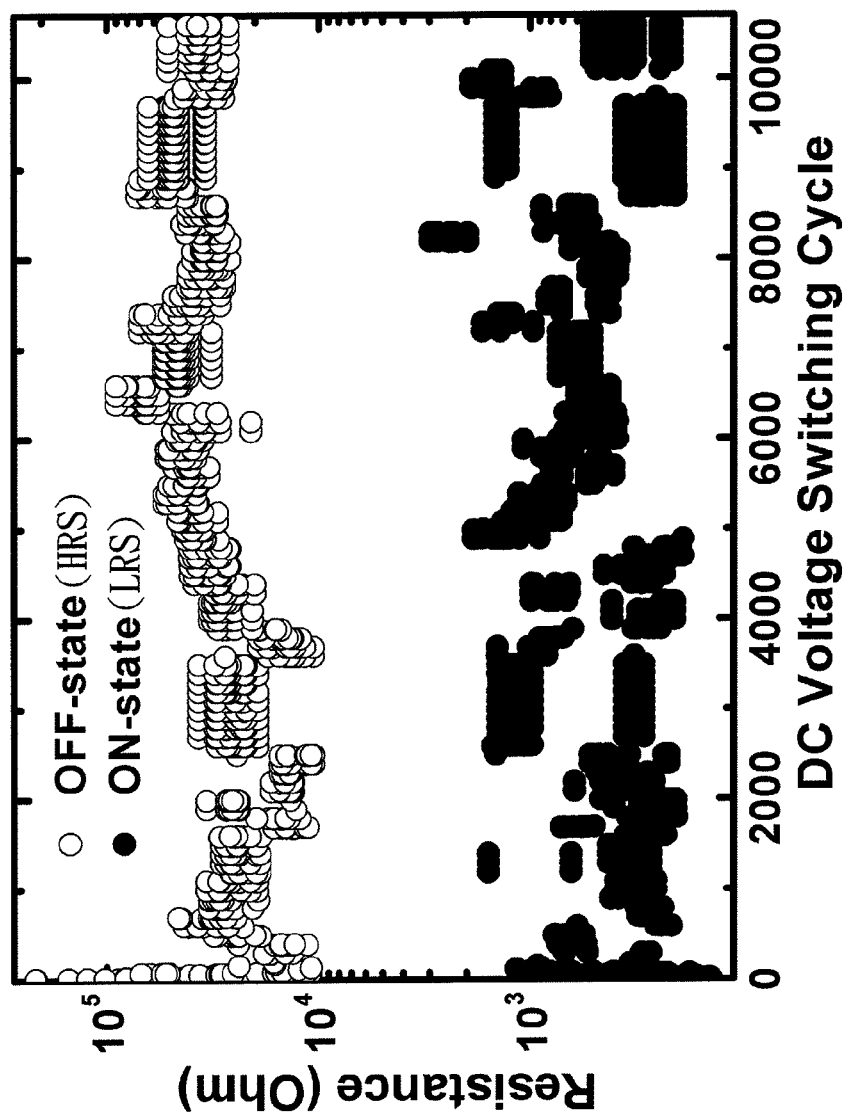
FIG. 1 is a plot of resistance vs. DC voltage switching cycle to illustrate the endurance test for a resistor of Example 2 (E2)

An endurance test for Example 2 (E2) was conducted by cyclically applying a DC voltage sweep to the top electrode (Ti electrode) of Example 2 (E2) using a data acquisition instrument (instrument trade name: Agilent 4155C). The sweeping direction is from 0V to +1.5 V, back to 0 V, then to −2.5 V, and back to 0 V with a sweeping voltage step of 0.1 V. During the voltage sweeping cycle, +1.5 V is an applied positive voltage span to permit the variable resistance layer of ZrO$_2$ to be set to ON-state (LRS), and −2.5 V is an applied negative voltage span to permit the variable resistance layer of ZrO$_2$ to be set to OFF-state (HRS). As for the endurance test of Example 2 (E2), both the ON-state and OFF-state resistance values of each cycle were measured and recorded by a reading voltage of 0.3 V. Referring to FIG. 1, the resistor of Example 2 (E2) can be continuously switched between ON-state and OFF-state for over 10$^4$ times during the DC voltage sweeping spans. In addition, the resistor of Example 1 (E1) and Example 3 (E3) can be continuously switched between ON-state and OFF-state for about 6800 times and 7300 times (see Table 1) respectively, during the same DC voltage sweeping spans. However, the resistor of Comparative Examples (CE1~CE2) only can be continuously switched between ON-state and OFF-state for about 4000 times and 6100 times, respectively, during the same DC voltage sweeping spans.

TABLE 1

| Examples | Working temperature (° C.) | Endurance test (times) |
| --- | --- | --- |
| CE1 | 150 | 4000 |
| E1 | 175 | 6800 |
| E2 | 200 | 10599 |
| E3 | 225 | 7300 |
| CE2 | 250 | 6100 |

Figure 2:
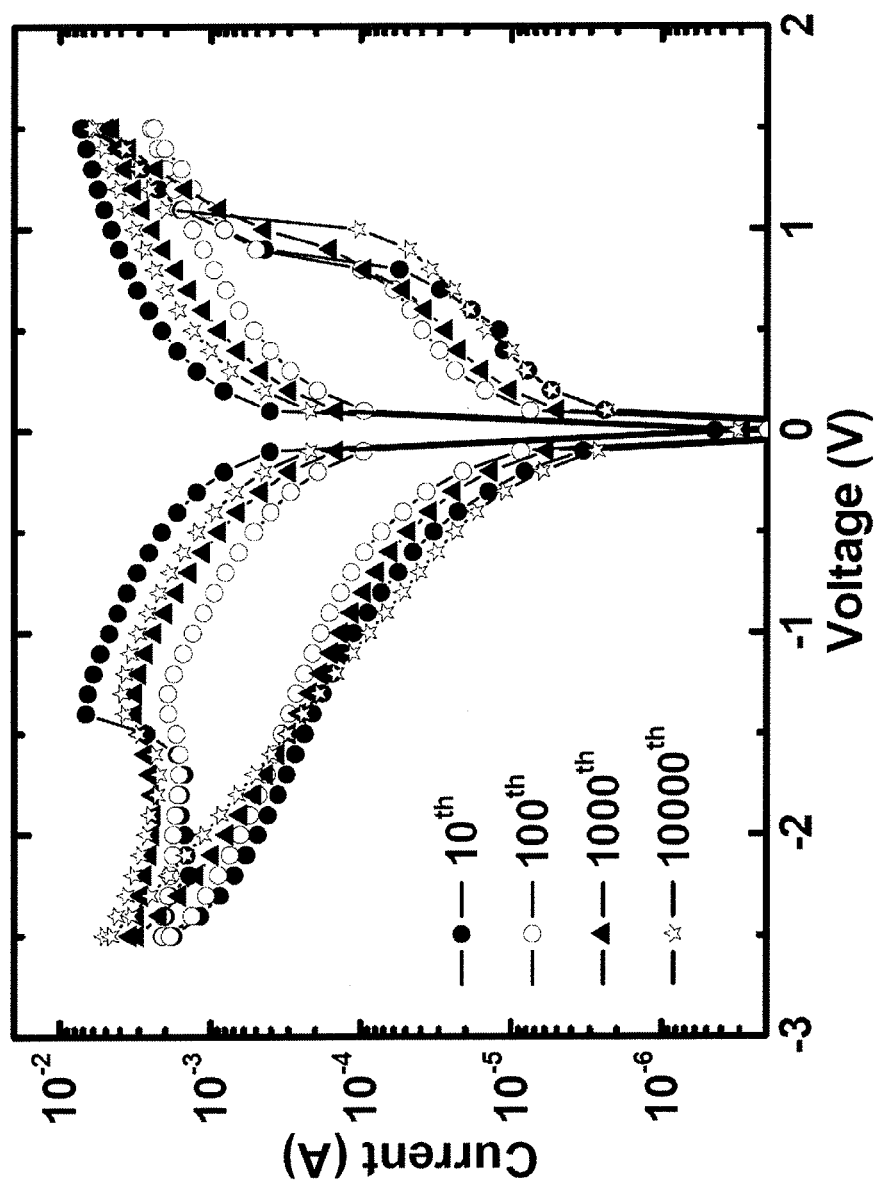
FIG. 2 is a plot of current vs. voltage to illustrate the stability of the DC voltage switching cycle for the resistor of Example 2 (E2)

FIG. 2 shows the measured current-voltage (I-V) curves of the test sample of Example 2 (E2), which depicts the 10$^{th}$ time 100$^{th}$ time, 1000$^{th}$ time, and 10000$^{th}$ time resistive switching cycles, respectively. The I-V curves shown in FIG. 2 are close to each other, indicating that the resistor of Example 2 (E2) exhibit a stable electrical property.

Figure 3:
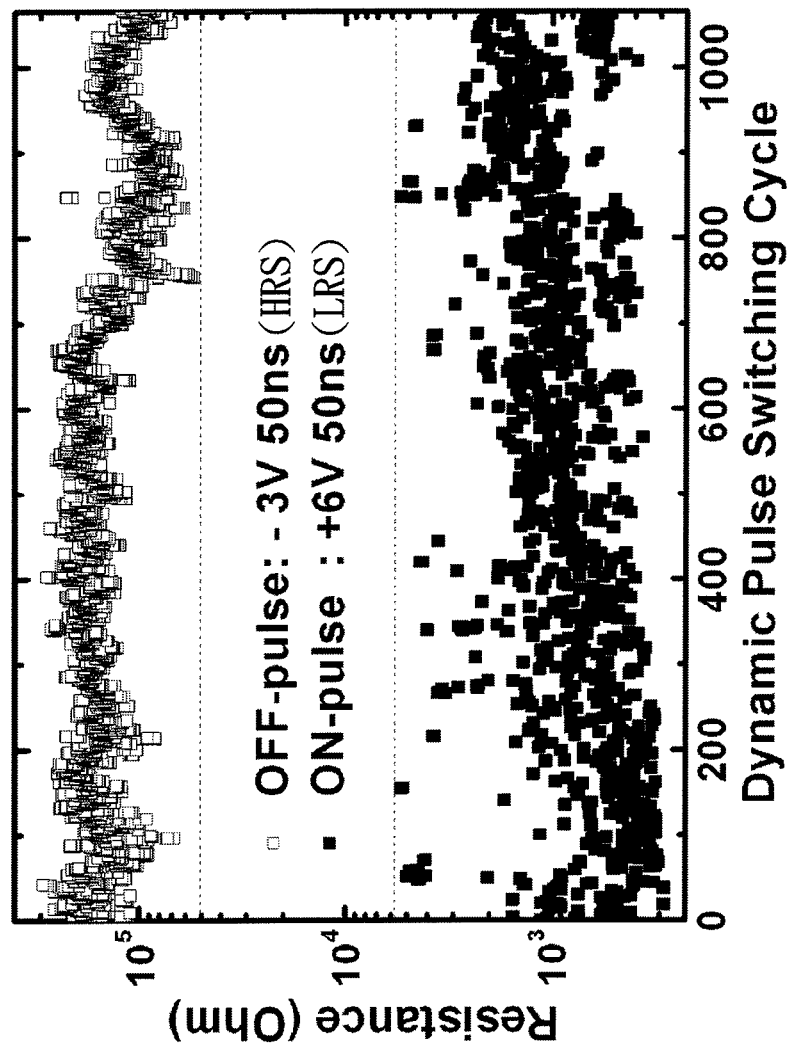
FIG. 3 is a plot of resistance vs. dynamic pulse switching cycle to illustrate the write/erase cycling test for the resistor of Example 2 (E2).

FIG. 3 shows the write/erase cycling test for Example 2 (E2). The write/erase cycling test of Example 2 (E2) was measured by alternately applying a switch-on voltage pulse of +6 V with a pulse-width of 50 ns and a switch-off voltage pulse of −3 V with a pulse width of 50 ns using a power supply (instrument trade name: Agilent 81110A). The resistance of the test sample was measured using the data acquisition instrument (Agilent 4155C), which was set to apply a reading voltage of 0.3 V to the test sample. The results shown in FIG. 3 indicate that the resistor of Example 2 (E2) can be rapidly switched in 50 ns from the write action to the erase action or from the erase action to the write action for over 1000 times.

In conclusion, by fabricating the variable resistance layer of zirconium oxide sandwiched between the bottom electrode of Pt and the top electrode of Ti under a working temperature ranging from 175° C. to 225° C., not only the endurance number of the switching times between ON-state and OFF-state of the resistor for RRAM application is increased, but also the aforesaid drawback of causing defects in the transistors (or the diodes) as encountered in the previous art is eliminated.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A method for fabricating a resistor for a resistance random access memory (RRAM), comprising:
   (a) forming a first electrode over a substrate;
   (b) depositing zirconium oxide on the first electrode by a sputtering technique under a working temperature ranging from 175° C. to 225° C. to form a variable resistance layer of zirconium oxide, wherein formation of the variable resistance zirconium oxide layer at said working temperature enhances a number of times that the resistor can be continuously switched between ON-state and OFF-state during a specified voltage sweeping span as compared with the number when the variable resistance zirconium oxide layer is formed at a working temperature of 250° C., the number being at least 6800 times when the variable resistance zirconium oxide layer is formed at said working temperature and the voltage sweeping span comprises application of a DC voltage sweep from 0 V to +1.5 V, back to 0 V, then to −2.5 V, and back to 0 V with a sweeping voltage step of 0.1 V; and (c) forming a second electrode of Ti on the variable resistance layer.

2. The method of claim 1, wherein formation of the first electrode in step (a) and the second electrode in step (c) is conducted through evaporation techniques.

3. The method of claim 1, wherein the first electrode includes a Ti adhesion layer deposited on the substrate and a Pt electrode layer deposited on the Ti layer.

4. A method for fabricating a resistor for a resistance random access memory comprising transistors or diodes, the method consisting essentially of the following steps:
   (a) forming a first electrode on a substrate;
   (b) forming a variable resistance layer of zirconium oxide on the first electrode under a working temperature of from 175° C. to 225° C. by a process comprising sputtering, wherein formation of the variable resistance zirconium oxide layer at said working temperature enhances a number of times that the resistor can be continuously switched between ON-state and OFF-state during a specified voltage sweeping span as compared with the number when the variable resistance zirconium oxide layer is formed at a working temperature of 250° C., the number being at least 6800 times when the variable resistance zirconium oxide layer is formed at said working temperature and the voltage sweeping span comprises application of a DC voltage sweep from 0 V to +1.5 V, back to 0 V, then to −2.5 V and back to 0 V with a sweeping voltage step of 0.1 V; and
   (c) forming a second electrode of Ti on the variable resistance layer.

5. The method of claim 4, wherein formation of the first electrode in step (a) and the second electrode in step (c) is by a process comprising evaporation.

6. The method of claim 4, wherein the first electrode includes a Ti adhesion layer deposited on the substrate and a Pt electrode layer deposited on the Ti layer.

7. A method for fabricating a resistor for a resistance random access memory (RRAM) comprising transistors or diodes, wherein the method comprises:
   (a) forming a first electrode over a substrate;
   (b) depositing zirconium oxide on the first electrode by a sputtering technique under a working temperature ranging from 175° C. to 225° C. to form a variable resistance layer of zirconium oxide, wherein formation of the variable resistance zirconium oxide layer at said working temperature enhances a number of times that the resistor can be continuously switched between ON-state and OFF-state during a specified voltage sweeping span as compared with the number when the variable resistance zirconium oxide layer is formed at a working temperature of 250° C., the number being at least 6800 times when the variable resistance zirconium oxide layer is formed at said working temperature and the voltage sweeping span comprises application of a DC voltage sweep from 0 V to +1.5 V, back to 0 V, then to −2.5 V, and back to 0 V with a sweeping voltage step of 0.1 V; and
   (c) forming a second electrode of Ti on the variable resistance layer.

* * * * *